US012739975B2

(12) United States Patent
Lee

(10) Patent No.: US 12,739,975 B2

(45) Date of Patent: Sep. 15, 2026

(54) PRINTED CIRCUIT BOARD

(71) Applicant: SAMSUNG ELECTRO-MECHANICS CO., LTD., Suwon-si (KR)

(72) Inventor: Jae Heun Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 296 days.

(21) Appl. No.: 18/443,560

(22) Filed: Feb. 16, 2024

(65) Prior Publication Data

US 2025/0008659 A1 Jan. 2, 2025

(30) Foreign Application Priority Data

Jun. 30, 2023 (KR) ........................ 10-2023-0084666

(51) Int. Cl.

*H05K 1/16* (2006.01)
*H05K 1/03* (2006.01)
*H05K 1/11* (2006.01)

(52) U.S. Cl.

CPC ........... *H05K 1/162* (2013.01); *H05K 1/0306* (2013.01); *H05K 1/116* (2013.01); *H05K 2201/09509* (2013.01)

(58) Field of Classification Search

CPC ...... H05K 1/162; H05K 1/0306; H05K 1/116; H05K 2201/09509; H05K 1/185; H05K 2201/10015; H05K 1/115; H05K 3/4644; H01G 4/018

See application file for complete search history.

(56) References Cited

U.S. PATENT DOCUMENTS 8,896,521 B2 * 11/2014 Lasiter ..................... H01G 4/06 345/204
2011/0095435 A1 * 4/2011 Volant ............... H01L 21/76898 257/E21.597
2012/0235969 A1 * 9/2012 Burns ................. B81C 1/00095 361/748
2017/0154838 A1 * 6/2017 Kim ........................ H01L 24/19
2021/0398891 A1 * 12/2021 Rho .................... H10W 70/635

FOREIGN PATENT DOCUMENTS

JP 2019102577 A 6/2019
KR 10-2018-0134868 A 12/2018
WO 2017/147511 A1 8/2017

* cited by examiner

*Primary Examiner* — Timothy J Thompson
*Assistant Examiner* — Aditya Sharma
(74) *Attorney, Agent, or Firm* — Morgan, Lewis & Bockius LLP

(57) ABSTRACT

The present disclosure relates to a printed circuit board including: a glass layer; a first wiring layer disposed on an upper surface of the glass layer; and a capacitor including a plurality of blind holes penetrating through a portion of the glass layer from an upper surface to a lower surface of the glass layer, respectively, a first electrode layer disposed on the upper surface of the glass layer and extending into each of the plurality of blind holes, a second electrode layer disposed on the first electrode layer and disposed in each of the plurality of blind holes, and a first dielectric layer disposed between the first and second electrode layers.

21 Claims, 12 Drawing Sheets

PRINTED CIRCUIT BOARD

CROSS-REFERENCE TO RELATED APPLICATION(S)

This application claims benefit of priority to Korean Patent Application No. 10-2023-0084666 filed on Jun. 30, 2023, in the Korean Intellectual Property Office, the disclosure of which is incorporated herein by reference in its entirety.

TECHNICAL FIELD

The present disclosure relates to a printed circuit board.

Package technology continues to develop, and specifically, attempts to use glass materials to break away from the use organic materials in traditional substrate manufacturing methods continue. Furthermore, in order to improve power characteristics, recent package substrates have adopted a structure in which passive elements such as chip capacitors and silicon capacitors are mounted outside a substrate, or passive elements such as chip capacitors or silicon capacitors are embedded after forming a through-cavity or a blind cavity in a core of the substrate. However, in this case, a process of mounting or embedding the passive elements needs to be added, and a cavity needs to be formed according to a size of the passive element, which may lead to a design restriction. Furthermore, process difficulty may increase when a number of passive elements are mounted. Furthermore, when the substrate is thick, the difficulty of cavity processing or an embedding process may increase.

SUMMARY

One aspect of the present disclosure is to provide a printed circuit board capable of forming a capacitor having a desired size and degree of capacitance without a design restriction.

The other aspect of the present disclosure is to provide a printed circuit board capable of omitting cavity processing and an embedding process.

Another aspect of the present disclosure is to provide a printed circuit board having a more excellent effect in terms of dispersion of an insulation thickness.

One of the various solutions proposed through the present disclosure is to form a wiring layer, a through-via, and a capacitor directly in a glass core.

According to an aspect of the present disclosure, a printed circuit board may include: a glass layer; a first wiring layer disposed on an upper surface of the glass layer; and a capacitor including a plurality of blind holes penetrating through a portion of the glass layer from an upper surface to a lower surface of the glass layer, respectively, a first electrode layer disposed on the upper surface of the glass layer and extending into each of the plurality of blind holes, a second electrode layer disposed on the first electrode layer and disposed in each of the plurality of blind holes, and a first dielectric layer disposed between the first and second electrode layers.

According to another aspect of the present disclosure, a printed circuit board may include: a glass layer; a through-hole penetrating through the glass layer from an upper surface to a lower surface of the glass layer; a plurality of blind holes respectively penetrating through a portion of the glass layer from the upper surface to the lower surface of the glass layer; a first conductor layer disposed on the upper surface and the lower surface of the glass layer and extending onto a wall surface of the through-hole and a wall surface and a bottom surface of each of the plurality of blind holes; a third conductor layer disposed on the first conductor layer and configured to disposed in each of the through-hole and the plurality of blind holes; and a dielectric layer disposed between the first and third conductor layers, on the upper surface of the glass layer, the wall surface of the through-hole, and the wall surface and the bottom surface of each of the plurality of blind holes.

One of various effects of the present disclosure is to provide a printed circuit board capable of forming a capacitor having a desired size and degree of capacitance without a design restriction.

The other effect of the present disclosure is to provide a printed circuit board capable of omitting cavity processing and an embedding process.

Another effect of the present disclosure is to provide a printed circuit board having a more excellent effect in terms of dispersion of an insulation thickness.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
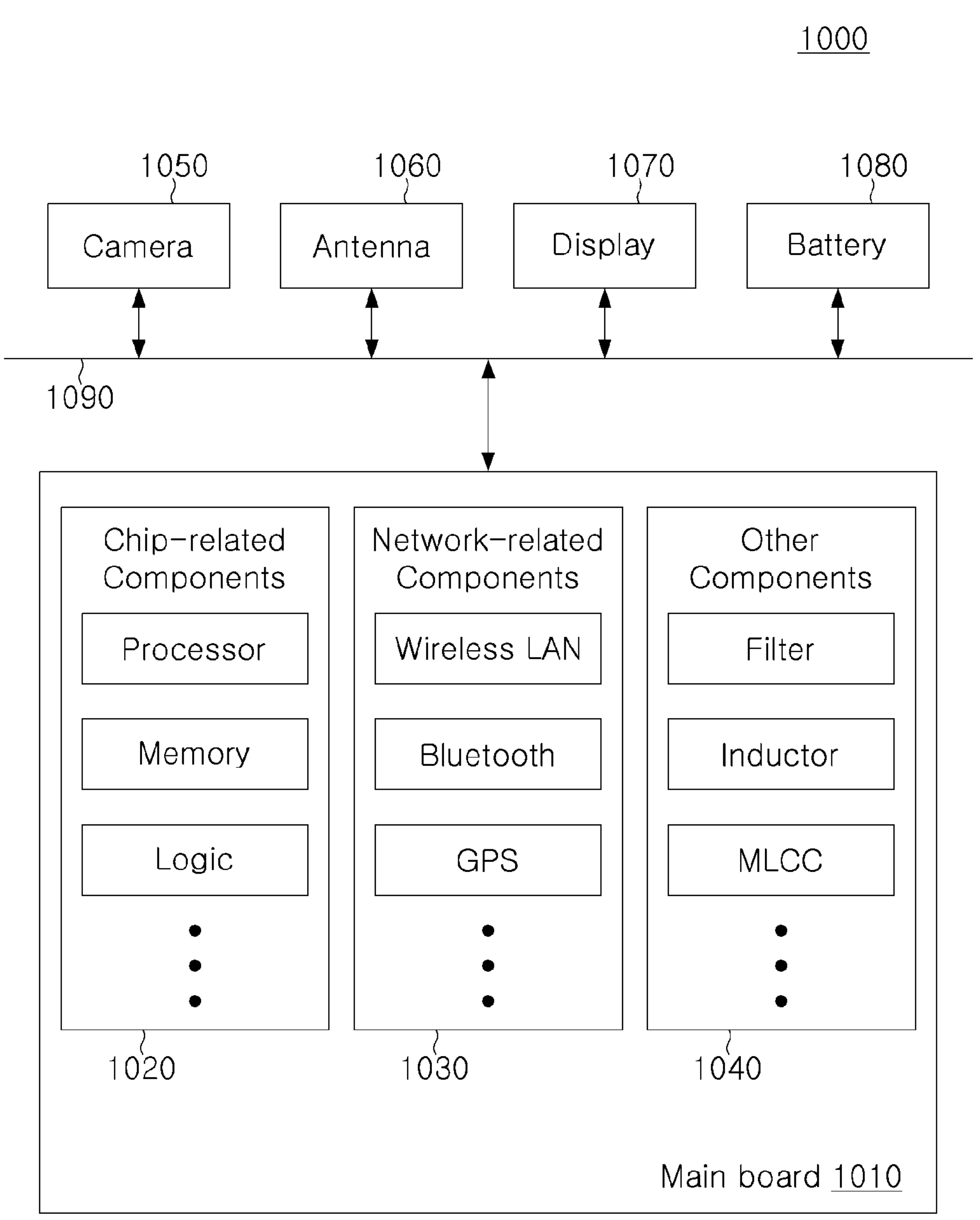
FIG. 1 is a block diagram schematically illustrating an example of an electronic device system.

Hereinafter, the present disclosure will be described with reference to the accompanying drawings. In the drawings, the shape and size of the elements may be exaggerated or reduced for clarity of description.

Electronic Device

FIG. 1 is a block diagram schematically illustrating an example of an electronic device system.

Referring to FIG. 1, an electronic device 1000 accommodates a main board 1010 therein. Chip-related components 1020, network-related components 1030, and other components 1040, and the like, are physically and/or electrically connected to the main board 1010. These components are also coupled to other electronic components to be described below to form various signal lines 1090.

The chip-related components 1020 may include a memory chip such as a volatile memory (e.g., a DRAM), a non-volatile memory (e.g., a ROM), a flash memory, or the like; an application processor chip such as a central processor (e.g., a CPU), a graphics processor (e.g., a GPU), a digital signal processor, a cryptographic processor, a microprocessor, a microcontroller, or the like; and a logic chip such as an analog-to-digital (ADC) converter, an application-specific IC (ASIC), or the like. However, the chip-related components 1020 are not limited thereto, and may also include other types of chip-related electronic components. Furthermore, the chip-related components 1020 may be coupled to each other. The chip-related component 1020 may be in the form of a package including the above-described chip or electronic component.

The network-related components 1030 may include wireless fidelity (Wi-Fi) (such as IEEE 802.11 family), worldwide interoperability for microwave access (WiMAX) (such as IEEE 802.16 family), IEEE 802.20, long term evolution (LTE), evolution data only (Ev-DO), HSPA+, HSDPA+, HSUPA+, EDGE, GSM, GPS, GPRS, CDMA, TDMA, DECT, Bluetooth, 3G, 4G, and 5G protocols, and any other wireless and wired standards or protocols specified thereafter. However, the network-related components 1030 are not limited thereto, and may also include any of a number of other wireless or wired standards or protocols. Furthermore, the network-related components 1030 may be coupled to the chip-related components 1020.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), or the like. However, other components are not limited thereto, and may also include passive components in the form of chip components used for various other purposes. In addition, other components 1040 may be coupled to each other, together with the chip-related components 1020 and/or the network-related components 1030.

Depending on a type of electronic device 1000, the electronic device 1000 may include other electronic components that may or may not be physically and/or electrically connected to main board 1010. These other electronic components may include, for example, a camera module 1050, an antenna module 1060, a display 1070, and a battery 1080. However, these other electronic components are not limited thereto, but may also include an audio codec, a video codec, a power amplifier, a compass, an accelerometer, a gyroscope, a speaker, a mass storage device (e.g., a hard disk drive), a compact disk (CD), a digital versatile disk (DVD), or the like. Furthermore, these other electronic components may also other electronic components used for various purposes depending on a type of electronic device 1000.

The electronic device 1000 may be a smartphone, a personal digital assistant, a digital video camera, a digital still camera, a network system, a computer, a monitor, a tablet PC, a laptop PC, a netbook PC, a television, a video game machine, a smartwatch, an automotive component. However, the electronic device 1000 is not limited thereto, and may be any other electronic device that processes data in addition thereto.

Figure 2:
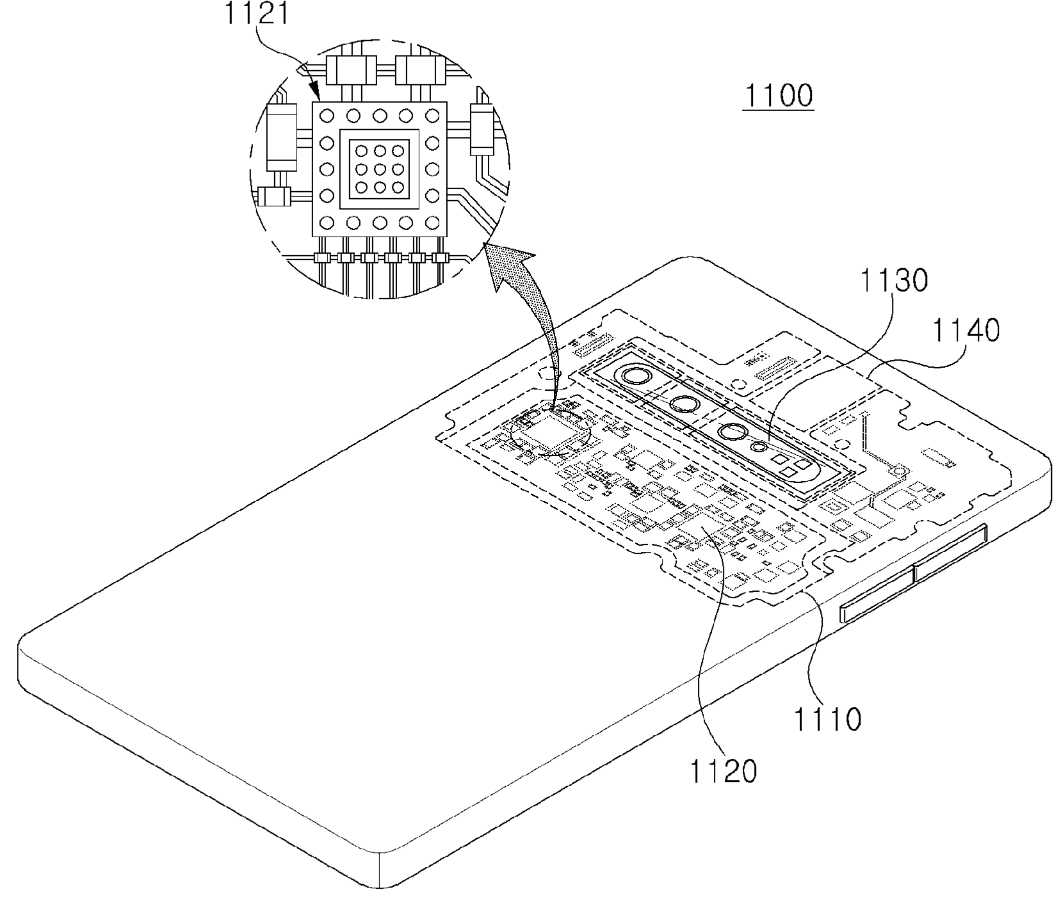
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A mother board 1110 may be accommodated in the smartphone 1100, and various components 1120 may be physically and/or electrically connected to the mother board 1110. Furthermore, other components that may or may not be physically and/or electrically connected to the mother board 1110, such as a camera module 1130 and/or a speaker 1140, may be accommodated in the smartphone 1100. Some of the components 1120 may be the chip-related components described above, for example, the component package 1121, but the present disclosure is not limited thereto. The component package 1121 may be in the form of a printed circuit board in which an electronic component including an active component and/or a passive component is mounted on a surface. Alternatively, the component package 1121 may be in the form of a printed circuit board in which an active component and/or a passive component are embedded. On the other hand, the electronic device is not necessarily limited to the smartphone 1100, and may be other electronic devices as described above.

Printed Circuit Board

Figure 3:
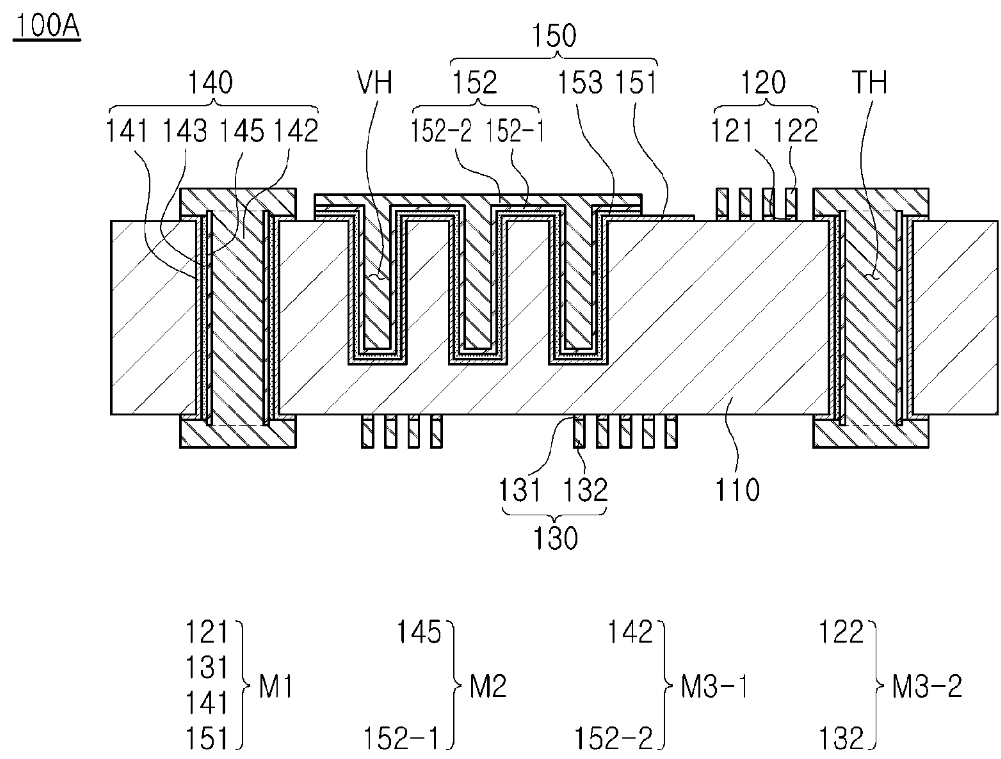
FIG. 3 is a perspective view schematically illustrating an example of a printed circuit board.

FIG. 3 is a cross-sectional view schematically illustrating an example of a printed circuit board.

Figure 4:
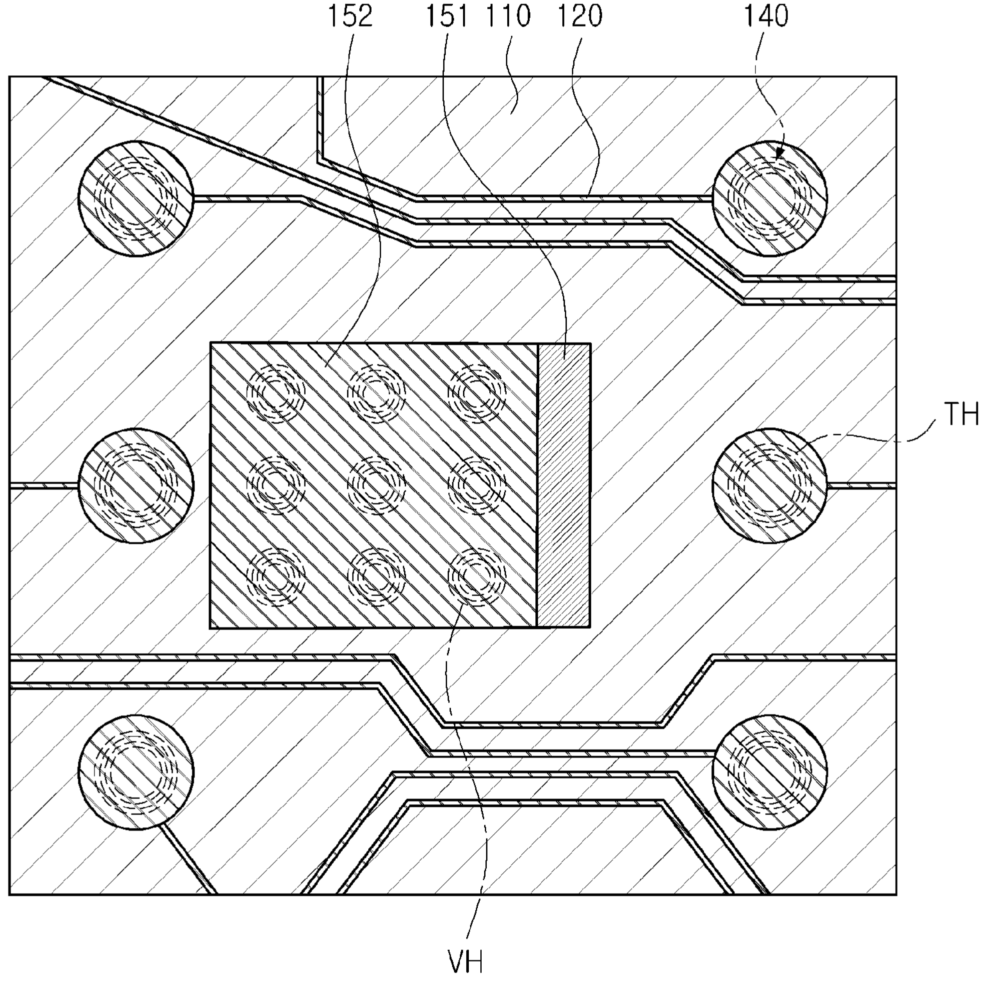
FIG. 4 is a plan view schematically illustrating a top view of the printed circuit board of FIG. 3.

FIG. 4 is a plan view schematically illustrating a top view of the printed circuit board of FIG. 3.

Referring to the drawings, a printed circuit board 100A according to an example embodiment may include a glass layer 110, a first wiring layer 120 disposed on an upper surface of the glass layer 110, a second wiring layer 130 disposed on a lower surface of the glass layer 110, a through-via 140 penetrating through the glass layer 110 and connecting at least a portion of each of first and second wiring layers 120 and 130, and a capacitor 150 disposed on the upper surface of the glass layer 110 and penetrating through at least a portion of the glass layer 110.

The first wiring layer 120 may include a first seed layer 121 disposed on the upper surface of the glass layer 110 and a first metal layer 122 disposed on an upper surface of the first seed layer 121. The second wiring layer 130 may include a second seed layer 131 disposed on the lower surface of the glass layer 110 and a second metal layer 132 disposed on a lower surface of the second seed layer 131. The through-via 140 may include a through-hole TH penetrating through the glass layer 110 from the upper surface to the lower surface of the glass layer 110, a third seed layer 141 disposed on a wall surface of the through-hole TH, a second dielectric layer 143 disposed on the third seed layer 141, a fourth seed layer 145 disposed on the second dielectric layer 143, and a third metal layer 142 disposed on the fourth seed layer 145 and filling the through-hole TH. The capacitor 150 may include a plurality of blind holes VH respectively penetrating through a portion of the glass layer 110 from the upper surface to the lower surface of the glass layer 110, a first electrode layer 151 disposed on the upper surface of the glass layer 110 and extending into each of the plurality of blind holes VH, a second electrode layer 152 disposed on the first electrode layer 151 and filling each of the plurality of blind holes VH, and a first dielectric layer 153 disposed between the first and second electrode layers 151 and 152. The second electrode layer 152 may include a fifth seed layer 152-1 disposed on the first dielectric layer 153 and a fourth metal layer 152-2 disposed on the fifth seed layer 152-1 and filling each of the plurality of blind holes VH.

The first to third seed layers 121, 131 and 141 may include the same metal as the first electrode layer 151. For example, the first to third seed layers 121, 131 and 141 and the first electrode layer 151 may be formed by electroless plating such as chemical copper plating. For example, the first to third seed layers 121, 131 and 141 and the first electrode layer 151 may be a first conductor layer M1. Since the first to third seed layers 121, 131 and 141 may be formed in a single plating process, and thus, a boundary may not exist at a connection portion between each of the first and second seed layers 121 and 131 and the third seed layer 141. That is, the first to third seed layers 121, 131 and 141 may be integrally formed with each other. The fourth and fifth seed layers 145 and 152-1 may include the same metal. For example, the fourth and fifth seed layers 145 and 152-1 may be formed by electroless plating such as chemical copper plating. The fourth and fifth seed layers 145 and 152-1 may be formed in a single plating process. For example, the fourth and fifth seed layers 145 and 152-1 may be a second conductor layer M2.

The first to fourth metal layers 122, 132, 142 and 152-2 may include the same metal. For example, the first to fourth metal layers 122, 132, 142 and 152-2 may be formed by electroplating such as electro-copper plating. For example, the first to fourth metal layers 122, 132, 142 and 152-2 may be a third conductor layer M3. Since the first and second metal layers 122 and 132 and the third metal layer 142 may be formed in two plating processes, a boundary may exist at a connection portion between each of the first and second metal layers 122 and 132 and the third metal layer 142. For example, the third and fourth metal layers 142 and 152-2 may be a third-first conductor layer M3-1, and the third-first conductor layer M3-1 may be disposed on at least a portion of the first conductor layer M1 and may fill the through-hole TH and each of the plurality of blind holes VH. Furthermore, the first and second metal layers 122 and 132 may be a third-second conductor layer M3-2, and the third-second conductor layer M3-2 may be disposed on at least another portion of the first conductor layer M1 and may cover a portion of the third-first conductor layer M3-1 filling the through-hole TH. The third-first and third-second conductor layers M3-1 and M3-2 may have boundaries at the connection portion.

The first and second dielectric layers 153 and 143 may include the same insulating material. For example, the first and second dielectric layers 153 and 143 may be formed in the same coating process. For example, the first and second dielectric layers 153 and 143 may be simultaneously formed through a single coating process. For example, the dielectric layer D may include the first and second dielectric layers 153 and 143. Accordingly, the first and second dielectric layers 153 and 143 may have substantially the same thickness.

At least a portion of each of the fourth seed layer 145 and the third metal layer 142 may protrude further upwardly than each of the third seed layer 141 and the second dielectric layer 143. At least another portion of each of the fourth seed layer 145 and the third metal layer 142 may protrude further downwardly than each of the third seed layer 141 and the second dielectric layer 143. The further protruding thickness of each of the fourth seed layer 145 and the third metal layer 142 may be substantially the same as a thickness of each of the first and second dielectric layers 153 and 143.

The first wiring layer 120, the first electrode layer 151, and the second electrode layer 152 may have different thicknesses on the upper surface of the glass layer 110. More specifically, on the upper surface of the glass layer 110, the first wiring layer 120 may be thicker than each of the first and second electrode layers 151 and 152, and the second electrode layer 152 may be thicker than the first electrode layer 151. For example, on the upper surface of the glass layer 110, the first seed layer 121 may be substantially the same thickness as the first electrode layer 151, and the first metal layer 122 may be thicker than the second electrode layer 152. For example, on the upper surface of the glass layer 110, the third-second conductor layer M3-2 may be thicker than the third-first conductor layer M3-1. For example, an upper surface of the first wiring layer 120 may be disposed on a different level from an upper surface of the second electrode layer 152. For example, the upper surface of the first wiring layer 120 may be disposed at a higher position than the upper surface of the second electrode layer 152.

At least a portion of the first electrode layer 151 on the upper surface of the glass layer 110 may extend in a horizontal direction so as not to be covered with the second electrode layer 152. For example, at least another portion of the first conductor layer M1 on the upper surface of the glass layer 110 may extend in a horizontal direction so as not to be covered with the third-first conductor layer M3-1. The first electrode layer 151, the second electrode layer 152, and the first dielectric layer 153 may have a step structure on the upper surface of the glass layer 110.

Since the printed circuit board 100A having the structure includes the glass layer 110 as a core layer, the printed circuit board 100A may have various advantages of using a glass material to break away from the use of an organic material. Furthermore, in the case of a substrate including a silicon core layer, even if the substrate has a structure in which the capacitor is embedded, a circuit can be formed only in a cross-section, and in the case of a capacitor embedded in a core layer, an insulating material must be added between silicon and metal whereas the printed circuit board 100A according to an example embodiment including a glass core layer may form a double-sided circuit, and also, since the glass itself can act as an insulation, the formation of an additional insulating material in the capacitor embedded in the core layer may be omitted. That is, the number of layers may be reduced.

Furthermore, the printed circuit board 100A having the structure may have the first and second wiring layers 120 and 130, the through-via 140, and the capacitor 150 directly formed on the glass layer 110, thereby forming a capacitor of a desired size and degree of capacitance without a design restriction as well as forming a microcircuit more easily. Furthermore, cavity processing and an embedding process for capacitor embedding may be omitted, and in this case, there may be no cavity that asymmetrically occupies a volume during embedding, thereby having a more excellent effect in terms of dispersion of an insulation thickness. Furthermore, the printed circuit board 100A according to an example embodiment may include a microcircuit and a capacitor, and may be used as a glass interposer mounted and disposed on a Flip Chip Bonding (FCB) substrate or a Ball Grid Array (BGA) substrate, and in this case, a plurality of semiconductor chips may be mounted and disposed on the printed circuit board 100A according to this example embodiment.

Hereinafter, components of the printed circuit board 100A according to an example embodiment will be described in more detail with reference to the drawings.

The glass layer 110 may include glass that is an amorphous solid. Glass may include, for example, pure silicon dioxide (about 100% $SiO_2$), soda lime glass, borosilicate glass, and alumino-silicate glass. However, the present disclosure is not limited thereto, and alternative glass materials, such as fluorine glass, phosphoric acid glass, chalcogen glass, etc., may also be used as materials. Other additives may also be included to form glass having specific physical properties. These additives may include magnesium, calcium, manganese, aluminum, lead, boron, iron, chromium, potassium, sulfur, and antimony, as well as calcium carbonate (e.g., lime) and sodium carbonate (e.g., soda).

The glass layer 110 may be a layer distinct from organic insulating materials including glass fibers (Glass Fiber, Glass Cloth and Glass Fabric), such as Copper Clad Laminate (CCL) and Prepreg (PPG). For example, the glass layer 110 may include plate glass. The glass layer 110 may be a core layer. For example, the glass layer 110 may be a glass core.

The through-hole TH may penetrate through the glass layer 110 in a thickness direction. For example, the through-hole TH may penetrate between the upper and lower surfaces of the glass layer 110. The through-hole TH may have one or more holes. The through-hole TH may be in the form of an elliptical column or a circular column, but the present disclosure is not limited thereto, and the through-hole TH may be in the form of an hourglass column.

The blind hole VH may partially penetrate through the glass layer 110 in the thickness direction. For example, the blind hole VH may penetrate through a portion of the glass layer 110 from the upper surface to the lower surface of the glass layer 110. There may be a plurality of blind holes VH. The blind hole VH may be in the form of an elliptical column or a circular column, but is not limited thereto, and may be in the form of an hourglass column or the like. Furthermore, an edge of a bottom surface thereof may be in a round shape.

Each of the first and second wiring layers 120 and 130 may perform various functions according to a design. For example, the first and second wiring layers 120 and 130 may include a signal pattern, a power pattern, and a ground pattern, and each of these patterns may have various forms such as a line (or a trace), a plane (or a plate), a pad (or a land). Each of the first and second wiring layers 120 and 130 may include an electroless plating layer (or chemical copper) and an electrolytic plating layer (or electric copper). If necessary, the first and second wiring layers 120 and 130 may include a sputtering layer instead of an electroless plating layer (or chemical copper), or may include both the electroless plating layer (or chemical copper) and the sputtering layer.

The through-via 140 may perform various functions according to a design. For example, the through-via 140 may include a ground via, a power via, and a signal via. The through-via 140 may include an electroless plating layer (or chemical copper) and an electrolytic plating layer (or electric copper). If necessary, the through-via 140 may include a sputtering layer instead of an electroless plating layer (or chemical copper), or may include both the electroless plating layer (or chemical copper) and the sputtering layer.

The capacitor 150 may store electrical capacitance as electrical potential energy through the plurality of blind holes VHs, the first electrode layer 151, the second electrode layer 152, and the first dielectric layer 153. For example, the capacitor 150 may function as an electronic device configured to output a current by charging a voltage using a characteristic in which charging and discharging are repeated. Accordingly, unstable power may be controlled, and noise may be removed. Furthermore, the capacitor 150 can block a direct current and allow an alternating current to pass. Furthermore, the capacitor 150 may be used for stable operation of a semiconductor chip.

The first to fifth seed layers 121, 131, 141, 145 and 152-1 and the first electrode layer 151 may include copper (Cu), aluminum (Al), silver (Ag), tin (Sn), gold (Au), nickel (Ni), lead (Pb), titanium (Ti), and/or alloys thereof, and may include, preferably, copper (Cu), but the present disclosure is not limited thereto. The first to third seed layers 121, 131 and 141 may be integrated layers having no boundaries at connection portions with each other. Each of the first to fifth seed layers 121, 131, 141, 145 and 152-1 and the first electrode layer 151 may be formed in electroless plating (e.g., chemical copper plating) and/or sputtering.

The first to fourth metal layers 122, 132, 142 and 152-2 may include copper (Cu), aluminum (Al), silver (Ag), tin (Sn), gold (Au), nickel (Ni), lead (Pb), titanium (Ti), and/or alloys thereof, respectively, and may include, preferably, copper (Cu), but the present disclosure not limited thereto. Each of the first to fourth metal layers 122, 132, 142 and 152-2 may be formed in electroplating (e.g., electro-copper plating). Each of the first to fifth seed layers 121, 131, 141, 145 and 152-1 and the first electrode layer 151 may have thicknesses thinner than each of the first to fourth metal layers 122, 132, 142 and 152-2.

The first and second dielectric layers 153 and 143 may include at least one of alumina, silica, silicon nitride, tantalum oxide, titanium oxide, calcium titanate, barium titanate, and strontium titanate in terms of insulation or relative dielectric constant. However, the present disclosure is not limited thereto, and the first and second dielectric layers 153 and 143 may include an organic polymer insulating material.

Figure 5A:
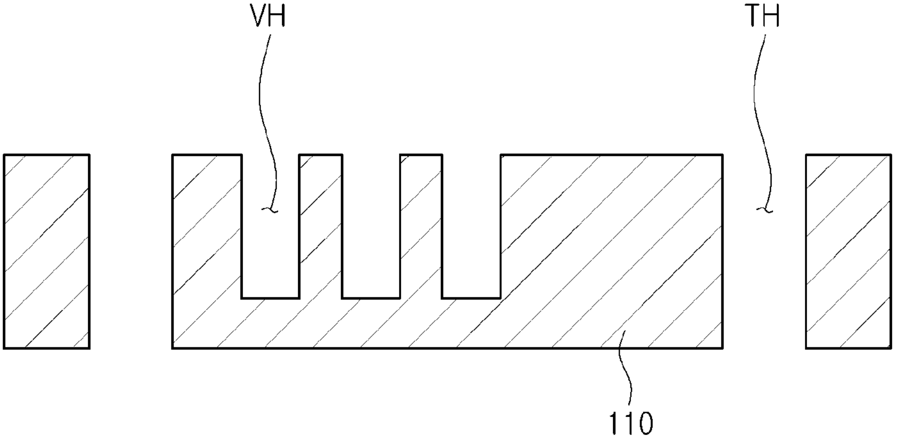
FIGS. 5A to 5N are process cross-sectional views schematically illustrating an example of manufacturing the printed circuit board of FIG. 3.
Figure 5B:
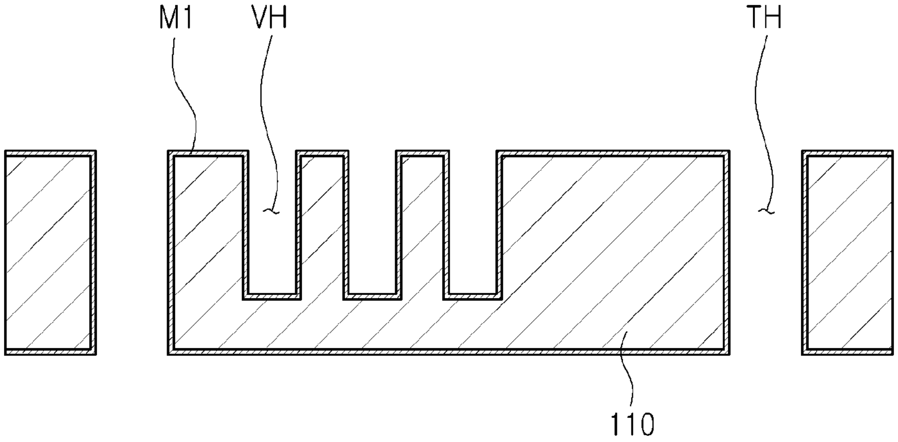
Figure 5C:
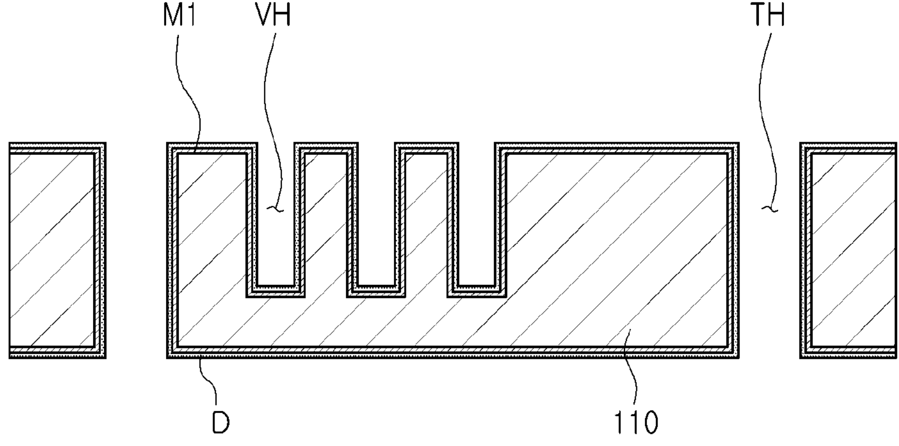
Figure 5D:
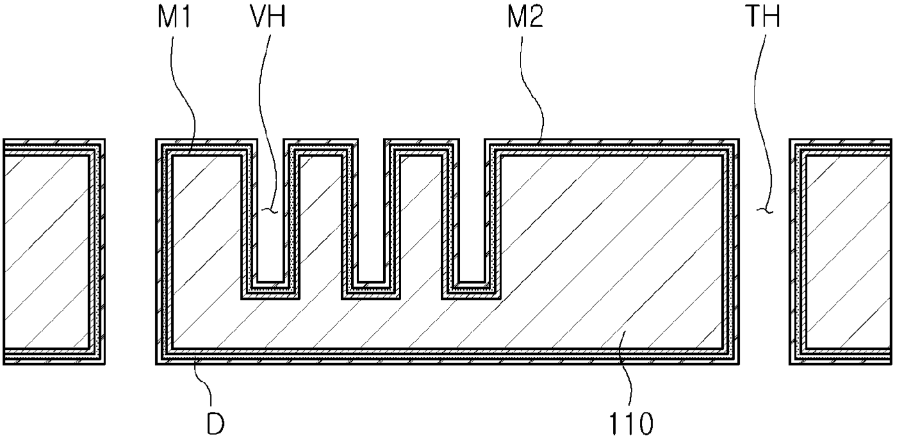
Figure 5E:
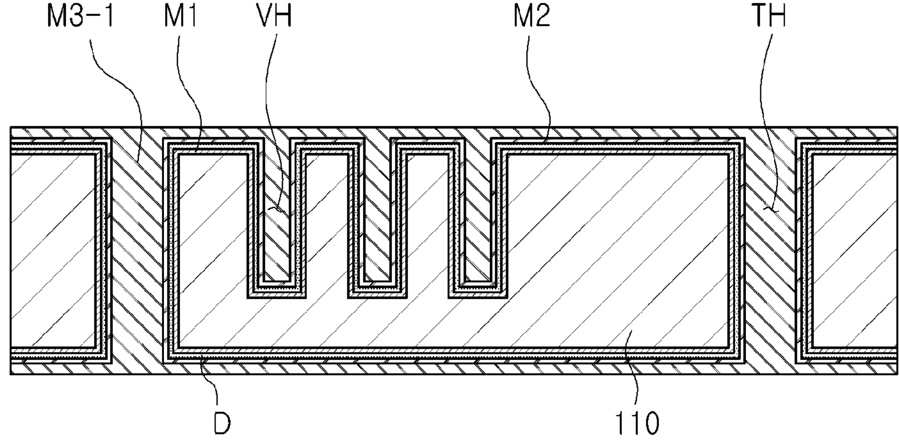
Figure 5F:
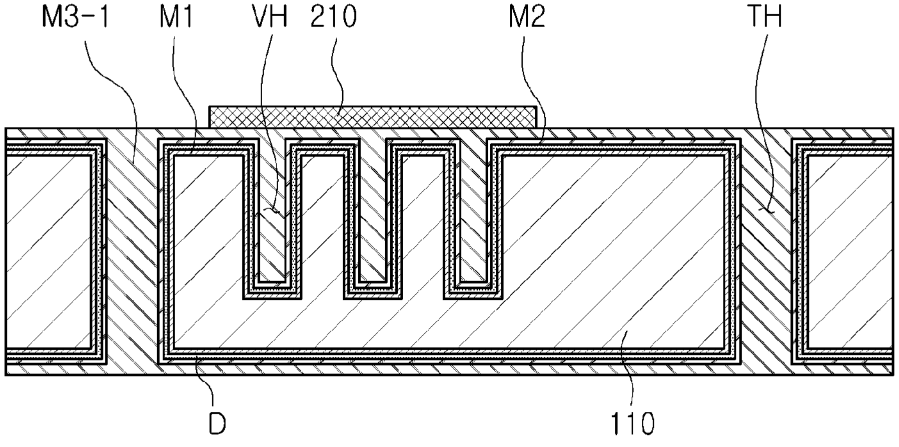
Figure 5G:
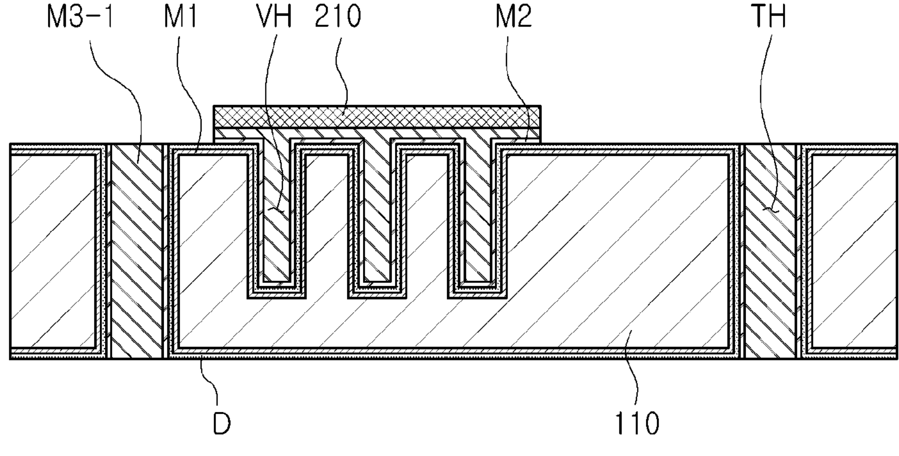
Figure 5H:
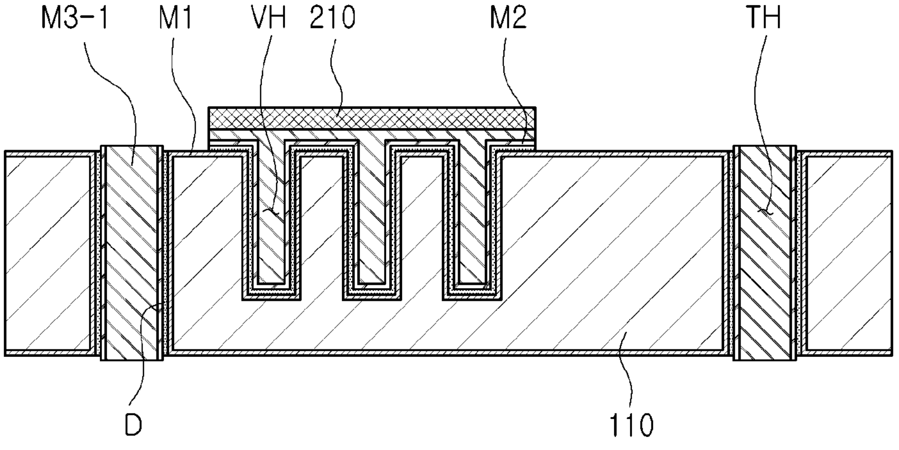
Figure 5I:
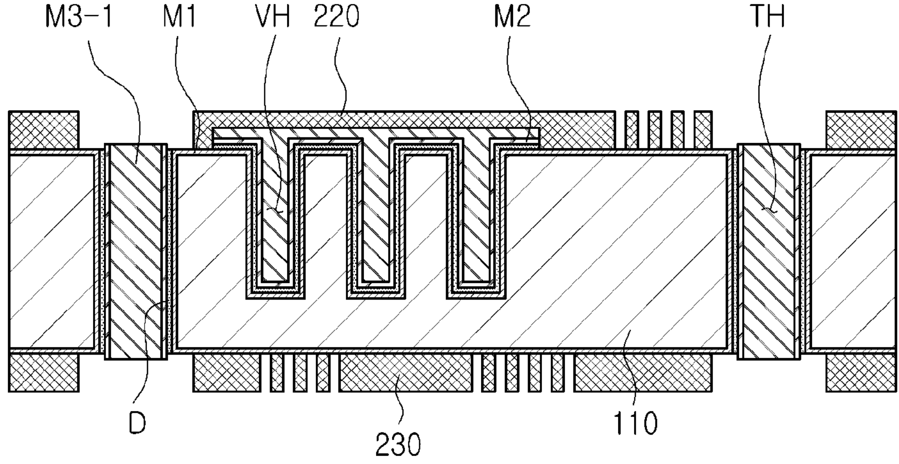
Figure 5J:
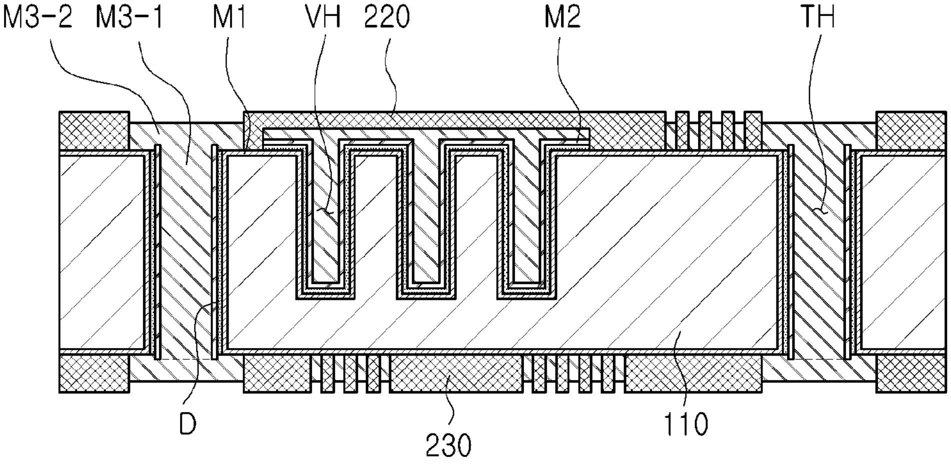
Figure 5K:
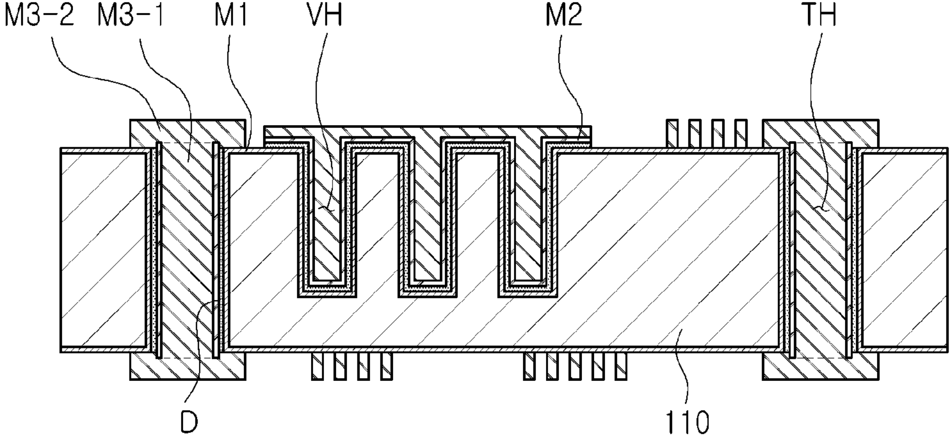
Figure 5L:
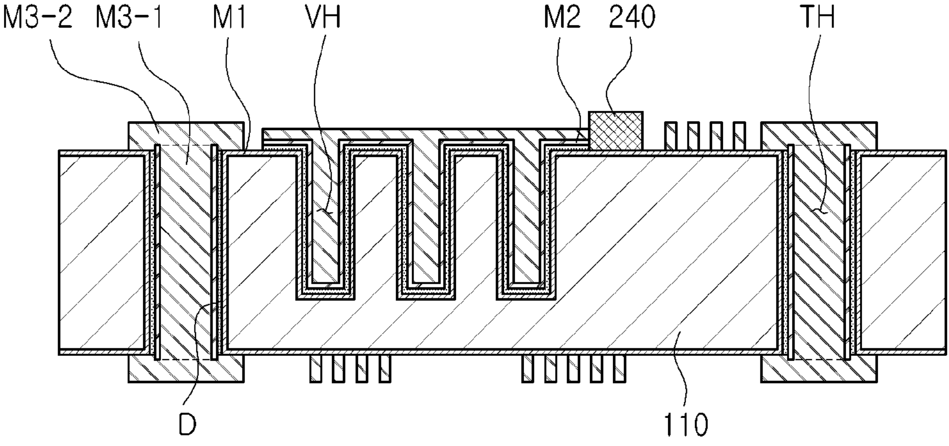
Figure 5M:
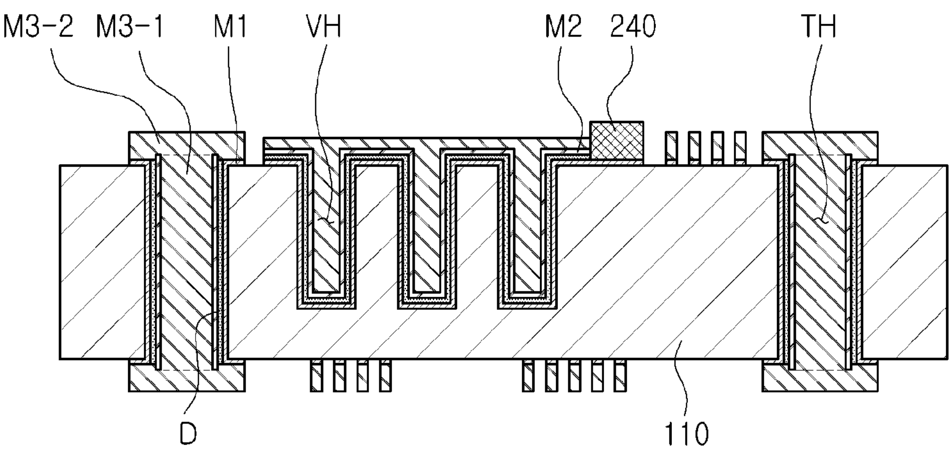
Figure 5N:
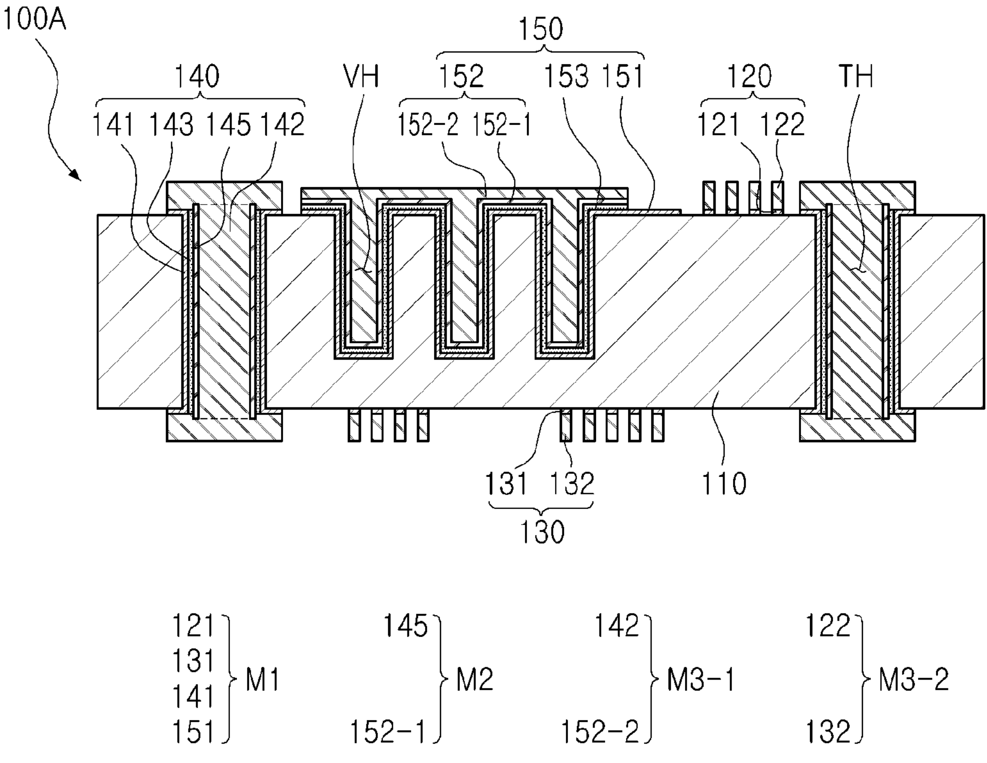

FIGS. 5A to 5N are process cross-sectional views schematically illustrating an example of manufacturing the printed circuit board of FIG. 3.

Referring to FIG. 5A, a glass layer 110 is prepared, and a through-hole TH and a plurality of blind holes VH are formed in the glass layer 110. The through-hole TH and the plurality of blind holes VH may be formed in various methods such as laser processing, mechanical processing, and chemical processing.

Referring to FIG. 5B, a first conductor layer M1 is formed on an upper surface and a lower surface of a glass layer 110, a wall surface of a through-hole TH, and a wall surface and a bottom surface of each of a plurality of blind holes VH. The first conductor layer M1 may be formed in electroless plating, for example, chemical copper plating. If necessary, the first conductor layer M1 may be formed in a sputtering process.

Referring to FIG. 5C, a dielectric layer D is formed on the first conductor layer M1. The dielectric layer D may be formed in the form of a thin film through a known coating process.

Referring to FIG. 5D, a second conductor layer M2 is formed on the dielectric layer D. The second conductor layer M2 may be formed in electroless plating, for example, chemical copper plating. If necessary, the second conductor layer M2 may be formed in a sputtering process.

Referring to FIG. 5E, a third-first conductor layer M3-1 is formed on the second conductor layer M2. The third-first conductor layer M3-1 may fill the through-hole TH and the plurality of blind holes VH. The third-first conductor layer M3-1 may be formed in electroplating, for example, electro-copper plating.

Referring to FIG. 5F, a first dry film 210 is formed on a portion of the third-first conductor layer M3-1. The first dry film 210 may be formed by attaching an uncured insulating film and then curing the insulating film, but the present disclosure is not limited thereto, and the first dry film 210 may be formed in a coating process.

Referring to FIG. 5G, an etching process is performed. By means of the etching process, the second and third-first conductive layers M2 and M3-1 may be removed from the remaining region except for a region covered with the first dry film 210.

Referring to FIG. 5H, the first dry film 210 is peeled off, and disposed on the upper surface and the lower surface of the glass layer 110, thus removing a portion of an exposed dielectric layer D in the etching process. When the dielectric layer D is removed, the first conductor layer M1 may be exposed.

Referring to FIG. 5I, second and third dry films 220 and 230 having patterned openings for the formation of a circuit are formed on the upper surface and the lower surface of the glass layer 110, respectively. Each of the second and third dry films 220 and 230 may be formed by attaching an uncured insulating film and then curing the insulating film, but the present disclosure is not limited thereto, and the second and third dry films 220 and 230 may be formed in a coating process.

Referring to FIG. 5J, the patterned openings of each of the second and third dry films 220 and 230 are filled with electroplating, for example, electro-copper plating, thereby forming a third-second conductor layer M3-2.

Referring to FIG. 5K, the second and third dry films 220 and 230 are peeled off.

Referring to FIG. 5L, a fourth dry film 240 is formed on a portion of the first conductor layer M1. The fourth dry film 240 may be formed by attaching an uncured insulating film and then curing the insulating film, but the present disclosure is not limited thereto, and the fourth dry film 240 may be formed in the coating process.

Referring to FIG. 5M, an etching process is performed. By means of the etching process, the first conductor layer M1 may be removed from the remaining region except for a region covered with the fourth dry film 240.

Referring to FIG. 5N, the fourth dry film 240 is peeled off. Accordingly, the first and second wiring layers 120 and 130, the through-via 140 and the capacitor 150, including the first to fourth seed layers 121, 131, 141 and 145, the first to third metal layers 122, 132 and 142, the first and second electrode layers 151 and 152, and the first and second dielectric layers 153 and 143, may be formed. That is, the printed circuit board 100A according to the above-described example embodiment may be manufactured.

The other contents are substantially the same as described in the printed circuit board 100A according to the above-described example embodiment, and thus overlapping descriptions thereof are omitted.

Figure 6:
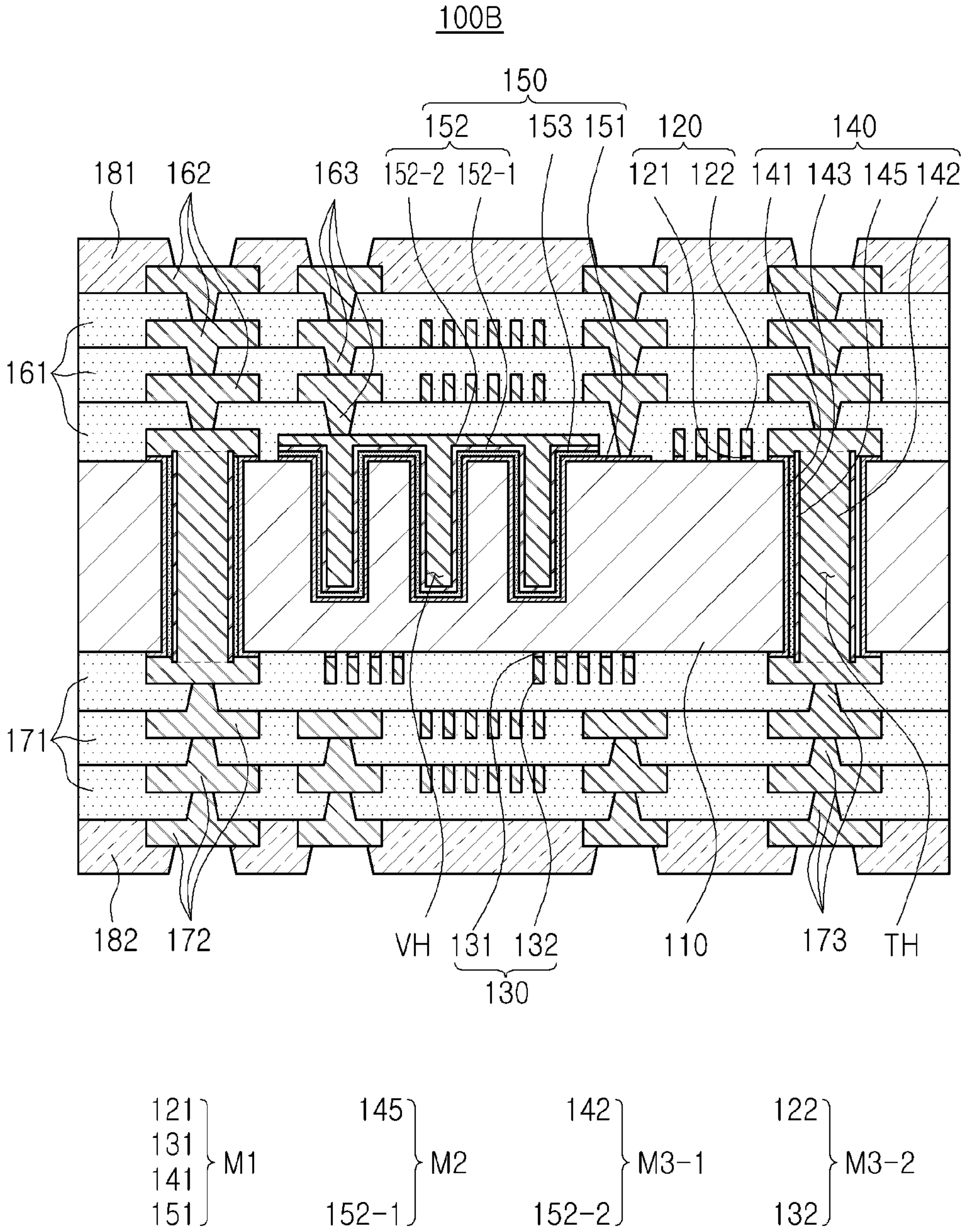
FIG. 6 is a cross-sectional view schematically illustrating another example of a printed circuit board.

FIG. 6 is a cross-sectional view schematically illustrating another example of a printed circuit board.

Referring to FIG. 6, a printed circuit board 100B according to another example embodiment may further include build-up layers disposed above and below the printed circuit board according to the above-described example embodiment. For example, the printed circuit board 100B according to another example embodiment may further include one or more first build-up insulating layers 161 disposed on an upper surface of a glass layer 110, one or more first build-up wiring layers 162 respectively disposed on or inside the one or more first build-up insulating layers 161, one or more first build-up via layers 163 respectively penetrating through at least one of the one or more first build-up insulating layers 161, one or more second build-up insulating layers 171 disposed on a lower surface of the glass layer 110, one or more second build-up wiring layers 172 respectively disposed on or inside the one or more second build-up insulating layers 171, one or more second build-up via layers 173 respectively penetrating through at least one of the one or more second build-up insulating layers 171, a first resist layer 181 disposed on a first build-up insulating layer 161 disposed on an uppermost side of the one or more first build-up insulating layers 161, and a second resist layer 182 disposed on a second build-up insulating layer 171 disposed on a lowermost side of the one or more second build-up insulating layers 171. For example, the printed circuit board 100B according to another example embodiment may be a film chip bonding (FCB) substrate or a ball grid array (BGA) substrate, which includes the glass layer 110 as a core layer.

Hereinafter, components of the printed circuit board 100B according to another example embodiment will be described in more detail with reference to the drawings.

Each of the first and second build-up insulating layers 161 and 171 may include an insulating material. The insulation material may include a thermosetting resin such as an epoxy resin, a thermoplastic resin such as polyimide, or materials including inorganic fillers, organic fillers, and/or glass fibers (Glass Fiber, Glass Cloth, and Glass Fabric) with these resins. For example, the insulating material may be a non-photosensitive insulating material such as an Ajinomoto Build-up Film (ABF) or prepreg (PPG), but the present disclosure is not limited thereto, and other polymer materials may be used as the insulating material. Furthermore, the insulating material may be a photosensitive insulating material such as a photo-imageable dielectric (PID). The one or more first and second build-up insulating layers 161 and 171 may include substantially the same insulating material as each other, or may include different insulating materials.

Each of the first and second build-up wiring layers 162 and 172 may include a metal. The metal may include copper (Cu), aluminum (Al), silver (Ag), tin (Sn), gold (Au), nickel (Ni), lead (Pb), titanium (Ti), and/or alloys thereof. The first and second build-up wiring layers 162 and 172 may include, preferably, copper (Cu), but the present disclosure is not limited thereto. The one or more first and second build-up wiring layers 162 and 172 may perform various functions according to a design. For example, the first and second build-up wiring layers 162 and 172 may include a signal pattern, a power pattern, and a ground pattern. Each of these patterns may have various shapes such as a line, a plane, and a pad. Each of the one or more first and second build-up wiring layers 162 and 172 may include an electroless plating layer (or chemical copper) and an electrolytic plating layer (or electric copper). Alternatively, the one or more first and second build-up wiring layers 162 and 172 may include a metal foil (or copper foil) and an electroplating layer (or electric copper). Alternatively, the one or more first and second build-up wiring layers 162 and 172 may include a metal foil (or copper foil), an electroless plating layer (or chemical copper), and an electrolytic plating layer (or electric copper). The one or more first and second build-up wiring layers 162 and 172 may include a sputtering layer instead of the electroless plating layer (or chemical copper), and may include both the sputtering layer and the electroless plating layer (or chemical copper) if necessary.

Each of the one or more first and second build-up via layers 163 and 173 may include a metal. The metal may include copper (Cu), aluminum (Al), silver (Ag), tin (Sn), gold (Au), nickel (Ni), lead (Pb), titanium (Ti), and/or alloys thereof. The first and second build-up via layers 163 and 173 may include, preferably, copper (Cu), but the present disclosure is not limited thereto. Each of the first and second build-up via layers 163 and 173 may include a field via filling a via hole, but may also include a conformal via disposed along a wall surface of the via hole. The one or more first and second build-up via layers 163 and 173 may perform various functions according to a design. For example, the first and second build-up via layers 163 and 173 may include a ground via, a power via, and a signal via. The first and second build-up via layers 163 and 173 may have tapered shapes in opposite directions on a cross-section. Each of the one or more first and second build-up via layers 163 and 173 may include an electroless plating layer (or chemical copper) and an electrolytic plating layer (or electric copper). The one or more first and second build-up via layers 163 and 173 may include a sputtering layer instead of the electroless plating layer (or chemical copper), and may include both the sputtering layer and the electroless plating layer (or chemical copper) if necessary.

The first and second resist layers 181 and 182 may include a liquid or film type solder resist, but the present disclosure is not limited thereto, and other types of insulating materials may be used as the first and second resist layers 181 and 182. Each of the first and second resist layers 181 and 182 may have first and second openings exposing patterns. If necessary, a surface treatment layer may be formed on a pattern exposed through the first opening and/or the second opening. Alternatively, a metal bump may be formed on a pattern exposed by the first opening and/or the second opening.

The other contents are substantially the same as described in the printed circuit board 100A according to the above-described example embodiment, and thus overlapping descriptions thereof are omitted.

In the present disclosure, a depth, a thickness, a width, and a length may be measured by a scanning microscope or an optical microscope based on a cross-section obtained by polishing or cutting each of printed circuit boards. The cut cross-section may be a vertical cross-section or a horizontal cross-section, and each numerical value may be measured based on a required cut cross-section. If a value is not constant, the value may be determined as an average value of values measured at any five random points.

In the present disclosure, the expression 'covering' may include a case of covering at least a portion as well as a case of covering the whole, and may also include a case of covering not only directly but also indirectly. Furthermore, the expression 'filling' may include not only a case of completely filling but also a case of approximately filling, and may include, for example, a case in which some pores or voids exist.

In the present disclosure, substantially, determination may be performed by including a process error or a positional deviation occurring in a manufacturing process, and an error during measurement. For example, being substantially the same line width, gap, thickness, and height may include not only those that are numerically completely the same, but also those that have approximately similar values. Furthermore, being substantially coplanar may include not only a case in which components exist on the completely same plane, but also a case in which components exist on approximately the same plane.

In the present disclosure, the same insulating material may mean not only a case of being completely the same insulating material, but also including the same type of insulating material. Thus, a composition of the insulating material may be substantially the same, but specific composition ratios thereof may be slightly different.

In the present disclosure, the meaning on the cross-section may refer to a cross-sectional shape when an object is cut vertically, or a cross-sectional shape when the object is viewed in a side-view. Furthermore, the meaning on a plane may refer to a planar shape when the object is horizontally cut, or a planar shape when the object is viewed in a top-view or a bottom-view.

In the present disclosure, a lower side, a lower portion, and a lower surface are used to refer to a downward direction with respect to a cross-section of a drawing, and an upper side, an upper portion, and an upper surface are used to refer to an opposite direction thereof. However, this defines the direction for convenience of explanation, and the scope of the rights of the claims is not particularly limited by the description of such a direction, and the concept of upper and lower portions may be changed at any time.

In the present disclosure, a meaning of being connected is a concept including not only directly connected but also indirectly connected through an adhesive layer or the like. Furthermore, a meaning of electrically connected is a concept including both physically connected and not connected. In addition, expressions such as first and second are used to distinguish one component from another, and do not limit the order and/or importance of the components. In some cases, a first component may be referred to as a second component without departing from the scope of rights, or similarly, the second component may be referred to as the first component.

The expression 'example embodiment used in the present disclosure' does not mean the same embodiment, and is provided to explain different unique characteristics. However, the example embodiments presented above do not preclude being implemented in combination with features of other example embodiments. For example, even if matters described in a particular example embodiment are not described in other example embodiments, they may be understood as explanations related to other example embodiments unless there is an explanation contrary to or contradictory to matters in other example embodiments.

The terms used in the present disclosure are used only to describe an example embodiment and are not intended to limit the present disclosure. In this case, singular expressions include plural expressions unless they are clearly meant differently in the context.

What is claimed is:

1. A printed circuit board comprising:

a glass layer;

a first wiring layer disposed on an upper surface of the glass layer; and a capacitor including a plurality of blind holes penetrating through a portion of the glass layer from an upper surface to a lower surface of the glass layer, respectively, a first electrode layer disposed on the upper surface of the glass layer and extending into each of the plurality of blind holes, a second electrode layer disposed on the first electrode layer and disposed in each of the plurality of blind holes, and a first dielectric layer disposed between the first and second electrode layers, wherein at least a part of the first electrode layer extends along the upper surface of the glass layer so as not to be covered with the second electrode layer, and wherein the blind holes are spaced apart from the lower surface of the glass layer.

2. The printed circuit board according to claim 1, wherein on the upper surface of the glass layer, the first wiring layer, the first electrode layer, and the second electrode layer have different thicknesses.

3. The printed circuit board according to claim 2, wherein on the upper surface of the glass layer, the first wiring layer is thicker than the second electrode layer, and the second electrode layer is thicker than the first electrode layer.

4. The printed circuit board according to claim 1, wherein the first wiring layer comprises:

a first seed layer disposed on the upper surface of the glass layer; and a first metal layer disposed on an upper surface of the first seed layer.

5. The printed circuit board according to claim 4, wherein on the upper surface of the glass layer, the first seed layer has substantially the same thickness as the first electrode layer, and the first metal layer is thicker than the second electrode layer.

6. The printed circuit board according to claim 4, further comprising:

a second wiring layer disposed on the lower surface of the glass layer, wherein the second wiring layer comprises:

a second seed layer disposed on the lower surface of the glass layer; and a second metal layer disposed on a lower surface of the second seed layer.

7. The printed circuit board according to claim 6, further comprising:

a through-via penetrating through the glass layer and connecting at least a portion of each of the first and second wiring layers to each other, wherein the through-via comprises:

a through-hole penetrating through the glass layer from the upper surface to the lower surface of the glass layer;

a third seed layer disposed on a wall surface of the through-hole;

a second dielectric layer disposed on the third seed layer;

a fourth seed layer disposed on the second dielectric layer, and a third metal layer disposed on the fourth seed layer and disposed in the through-hole.

8. The printed circuit board according to claim 7, wherein the first and second dielectric layers include the same insulating material.

9. The printed circuit board according to claim 7, wherein no boundary exists at connection portions between each of the first and second seed layers and the third seed layer, and a boundary exists at connection portions between each of the first and second metal layers and the third metal layer.

10. The printed circuit board according to claim 7, wherein with respect to the upper surface of the glass layer, at least a portion of each of the fourth seed layer and the third metal layer protrudes further upwardly than each of the third seed layer and the second dielectric layer, and with respect to the lower surface of the glass layer, at least another portion of each of the fourth seed layer and the third metal layer protrudes further downwardly than each of the third seed layer and the second dielectric layer.

11. The printed circuit board according to claim 10, wherein a further protruding thickness of at least a portion and at least another portion of each of the fourth seed layer and the third metal layer are substantially identical to a thickness of each of the first dielectric layer and the second dielectric layer.

12. The printed circuit board according to claim 7, further comprising:

one or more first build-up insulating layers disposed on the upper surface of the glass layer;

one or more first build-up wiring layers respectively disposed on or inside the one or more first build-up insulating layers;

one or more first build-up via layers respectively penetrating through at least one of the one or more first build-up insulating layers;

one or more second build-up insulating layers disposed on the lower surface of the glass layer;

one or more second build-up wiring layers respectively disposed on or inside the one or more second build-up insulating layers;

one or more second build-up via layers respectively penetrating through at least one of the one or more second build-up insulating layers;

a first resist layer disposed on a first build-up insulating layer disposed on an uppermost side of the one or more first build-up insulating layers; and a second resist layer disposed on a second build-up insulating layer disposed on a lowermost side of the one or more second build-up insulating layers.

13. The printed circuit board according to claim 1, wherein the second electrode layer comprises:

a fifth seed layer disposed on the first dielectric layer; and a fourth metal layer disposed on the fifth seed layer and disposed in each of the plurality of blind holes, and on the upper surface of the glass layer, the fourth metal layer is thicker than the fifth seed layer.

14. The printed circuit board according to claim 1, wherein the glass layer includes plate glass.

15. The printed circuit board according to claim 1, wherein an upper surface of the first wiring layer is disposed on a different level from an upper surface of the second electrode layer.

16. The printed circuit board according to claim 1, wherein the first electrode layer is in contact with the glass layer.

17. A printed circuit board comprising:

a glass layer;

a through-hole penetrating through the glass layer from an upper surface to a lower surface of the glass layer;

a plurality of blind holes respectively penetrating through a portion of the glass layer from the upper surface to the lower surface of the glass layer;

a first conductor layer disposed on the upper surface and the lower surface of the glass layer and extending onto a wall surface of the through-hole and a wall surface and a bottom surface of each of the plurality of blind holes;

a third conductor layer disposed on the first conductor layer and disposed in the through-hole and each of the plurality of blind holes; and a dielectric layer disposed between the first and third conductor layers, on the upper surface of the glass layer, the wall surface of the through-hole, and the wall surface and the bottom surface of each of the plurality of blind holes, wherein the blind holes are spaced apart from the lower surface of the glass layer.

18. The printed circuit board according to claim 17, wherein the third conductor layer comprises:

a third-first conductor layer disposed on at least a portion of the first conductor layer and disposed in the through-hole and each of the plurality of blind holes; and a third-second conductor layer disposed on at least another portion of the first conductor layer and covering a portion of the third-first conductor layer disposed in the through-hole, and on the upper surface of the glass layer, the third-second conductor layer is thicker than the third-first conductor layer.

19. The printed circuit board according to claim 18, wherein at least another portion of the first conductor layer extends along the upper surface of the glass layer so as not to be covered with the third-first conductor layer.

20. The printed circuit board according to claim 18, further comprising:

a second conductor layer disposed between the dielectric layer and the third-first conductor layer.

21. The printed circuit board according to claim 17, wherein the first conductor layer is in contact with the glass layer.

* * * * *